United States Patent [19]
Mohr

[11] Patent Number: 5,831,568
[45] Date of Patent: Nov. 3, 1998

[54] PROCESS FOR THE ANALOG/DIGITAL CONVERSION OF AN ELECTRIC SIGNAL AND DEVICE FOR IMPLEMENTING IT

[75] Inventor: Thomas Mohr, Buehl, Germany

[73] Assignee: Robert Bosch GmbH, Stuttgart, Germany

[21] Appl. No.: 765,224

[22] PCT Filed: Jun. 22, 1995

[86] PCT No.: PCT/DE95/00813

§ 371 Date: Jan. 6, 1997

§ 102(e) Date: Jan. 6, 1997

[87] PCT Pub. No.: WO96/02090

PCT Pub. Date: Jan. 25, 1996

[30] Foreign Application Priority Data

Jul. 7, 1994 [DE] Germany .......................... 44 23 955.6

[51] Int. Cl.⁶ .................................................. H03M 1/34
[52] U.S. Cl. ........................ 341/166; 341/128; 341/120; 341/172
[58] Field of Search .................... 341/120, 128, 341/166, 172

[56] References Cited

U.S. PATENT DOCUMENTS

| | | | |
|---|---|---|---|
| 3,849,775 | 11/1974 | Buchanan et al. | 341/116 |
| 4,281,317 | 7/1981 | Pace | 341/118 |
| 4,584,566 | 4/1986 | Arcara | 341/128 |
| 4,768,018 | 8/1988 | Noujaim | 341/166 |
| 4,876,544 | 10/1989 | Kuraishi | 341/166 |
| 5,200,752 | 4/1993 | Goeke | 341/166 |
| 5,347,279 | 9/1994 | Ishihara et al. | 341/166 |
| 5,384,570 | 1/1995 | Dedic | 341/172 |

OTHER PUBLICATIONS

U. Tietze et al.: "Halbleiter–Schaltungstechnik". Springer–Verlag, 1971, pp. 536–537.

Primary Examiner—Jeffrey A. Gaffin
Assistant Examiner—Kim N. Huynh
Attorney, Agent, or Firm—Spencer & Frank

[57] ABSTRACT

A process for the analog/digital conversion of an electric signal as well as a device for implementing the process is described. The process according to the invention provides that the time ($T_H$, $T_L$) be determined, which, starting from a voltage ($U_x$) to be converted is necessary to charge up a RC component (10, 12) to a predetermined reference voltage, for example a switching threshold ($S_H$, $S_L$) of a comparator (14) or to discharge it. The device according to the invention provides that a selector switch (13), the comparator (14) as well as a time detector (15) are components of a microprocessor (17), which is wired with the RC component (10, 12) as well as with an input resistor (11) if necessary. The process according to the invention as well as the device according to the invention are particularly easy to realize and are suitable for use especially with a microprocessor (17) which does not have an integrated analog/digital converter.

12 Claims, 2 Drawing Sheets

PROCESS FOR THE ANALOG/DIGITAL CONVERSION OF AN ELECTRIC SIGNAL AND DEVICE FOR IMPLEMENTING IT

BACKGROUND OF THE INVENTION

The invention refers to a process for the analog/digital conversion of an electric signal and a device for implementing the process. From the technical manual by U. Tietze and Ch. Schenk, "HALBLEITER-SCHALTUNGSTECHNIK" [Semiconductor Circuit Engineering], 2 nd edition 1971, pp 536–537, a process and a device for the analog/digital conversion of an electric signal are known, which are based on a double integrating precess. An integrator is set to the initial value zero in a first integrating step. In a second integrating step, the input voltage to be converted is integrated upward by the integrator to a predetermined time. Following completion of this predetermined time, a known reference voltage is fed to the integrator in a third process step in place of the voltage to be converted, which then integrates downward until the integrator once more reaches the initial value of zero. The time needed to integrate down is evaluated as a measure for the voltage to be converted. The elements required for the known double integrating process, for example an integrator, a comparator, a clock generator, a control logic as well as a counter are nowadays all components of integrated circuits.

SUMMARY OF THE INVENTION

It is the object of the invention to describe a process for the analog/digital conversion of an electric signal as well as a device for implementing this process, which can be realized simply, especially in connection with a microprocessor.

The solution to this problem is achieved by a process which includes the steps of connecting a capacitor with a first port to a fixed potential (GND), charging the capacitor up to a voltage to be converted by transmitting the converted voltage to a second port of the capacitor, comparing the voltage at the capacitor to a reference voltage and determining a recharging direction by selecting an operating voltage from a variable voltage source, recharging the capacitor by connecting the second port via a current-limiting element to the selected operating voltage which is higher or lower than the reference voltage, determining the time for the voltage change at the capacitor to reach the reference voltage and evaluating the determined time as a measure for the voltage to be converted.

The object of the invention is further achieved by a device for the analog/digital conversion of an electric voltage, the device including a capacitor having a first port which is connected to a fixed reference potential (GND) and a second port for receiving the voltage to be converted, a selector switch, an integrating resistor as a current-limiting element where the capacitor is connected to a voltage source via the selector switch and the integrating resistor, a comparator for switching the selector switch to one of a plurality of voltage sources and comparing the voltage at the capacitor with a reference voltage, wherein the direction of recharging the capacitor is determined by the selection of one of the plurality of voltage sources, and a time detector connected to the comparator for receiving the comparator output signal and for determining the time for the voltage change to reach the reference voltage at the capacitor wherein the determined time is evaluated as a measure for the voltage to be converted.

Advantages of the invention

The process according to the invention for the analog/digital conversion of an electric signal has the advantage that a relatively high accuracy can be achieved, which only depends on the tolerance of a resistance capacitor combination (RC component). One essential advantage is the particularly cost-effective realization, which requires few structural components. Particularly suited for the realization of this invention is a microprocessor, which does not have to comprise an analog/digital converter as a result of the process according to the invention.

In a first process step, the capacitor for the RC component is charged up to the voltage to be converted. In a second process step, the capacitor is connected via a current-limiting component to a voltage source, for which the voltage is higher or lower than a reference voltage. In a third process step, the time for the voltage change at the capacitor until the reference voltage is reached is determined. The time is a measure for the voltage to be converted.

Other advantageous modifications and embodiments of the inventive process for the analog/digital conversion of an electric signal can result as described below.

One advantageous embodiment provides that the reference voltage is realized with a comparator switching threshold. In the following, a comparator is also understood to be an input circuit of a logic component, for example a microprocessor, which has at least one defined switching threshold.

One advantageous modification of this measure provides that the comparator has a switching hysteresis, wherein two different switching thresholds develop. With this measure, it is possible to provide a further reliable range for the voltage to be converted.

Another advantageous embodiment provides that the selection between the higher or the lower voltage from the voltage source is provided in dependence on the comparator output signal. Having the control depend on the comparator output signal ensures that the voltage at the comparator, starting with the voltage to be converted, can always reach the comparator voltage.

Yet another advantageous further modification provides that one or preferably two switching thresholds of the comparator are determined adaptively. With this adaptive learning process, a high short-term stability and thus a high measuring accuracy can be achieved, independent of one or both of the switching thresholds for the comparator.

The device according to the invention has the advantage of a very cost-effective realization. The capacitor as a current-limiting element is connected via a resistor with a switch, which may have a high-ohmic switching state. The reference voltage is realized as threshold for the comparator.

Other advantageous embodiments and modifications of the device according to the invention for implementing the process for the analog/digital conversion of an electric signal can result as described below.

One particularly advantageous embodiment provides that the switch, the comparator as well as a time detector are components of a microprocessor. As previously mentioned, the comparator is an input circuit that constitutes part of the microprocessor, behind a microprocessor input port, which preferably has a hysteresis. Such inputs are also called Schmitt Trigger Inputs. The RC element as well as an input resistor, if necessary, are the only external components still necessary.

Other advantageous embodiments and modifications of the process according to the invention for the analog/digital conversion of an electric signal, as well as the device according to the invention for implementing the process follow from the following description.

DESCRIPTION OF THE PREFERRED EMBODIMENTS

Figure 1:
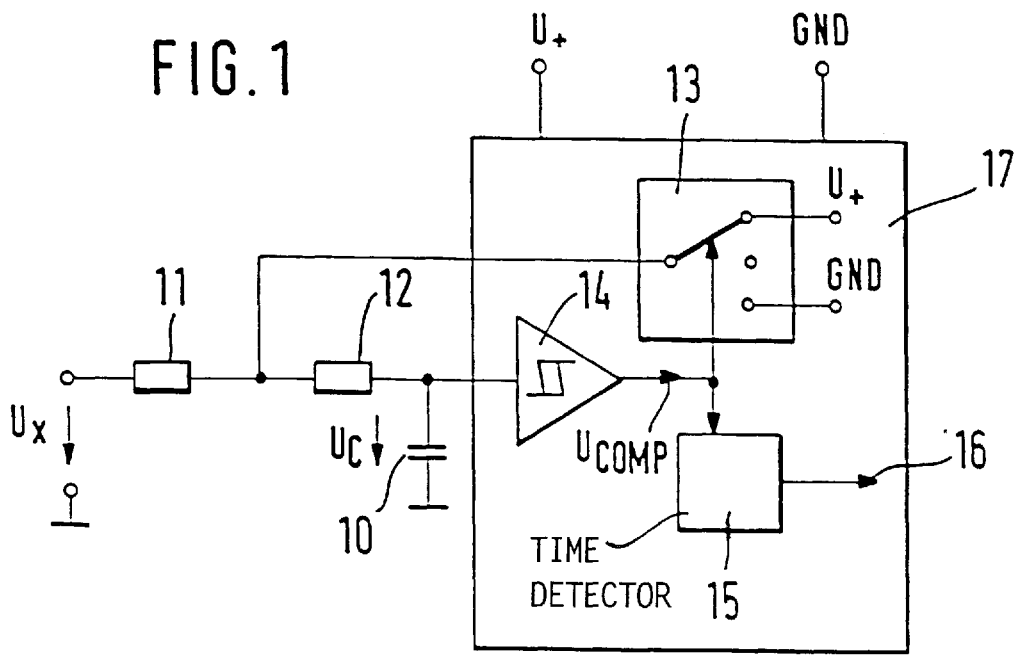
FIG. 1 shows a block diagram of a device according to the invention for implementing a process for the analog/digital conversion of an electric signal.

FIG. 1 shows a capacitor 10, which is respectively connected via an input resistor 11 and integrating resistor 12 to a voltage $U_X$ that is to be converted, and via the integrating resistor 12 to a selector switch 13, as well as to a comparator 14. The capacitor voltage $U_C$ is present at capacitor 10. The comparator 14 can have a switching hysteresis, which is symbolized by the sign entered into the comparator 14.

The comparator 14 transmits a comparator output signal $U_{COMP}$ to the selector switch 13 as to well as a time detector 15. The time detector 15 transmits a resulting signal 16, which represents a measure for the voltage $U_X$ to be converted.

The selector switch 13 has three switching positions. A first position connects the integrating resistor 12 with a positive operating voltage $U_+$. A second position of the selector switch 13 corresponds to a high-ohmic state and a third switching position of the selector switch 13 connects the integrating resistor 12 to a negative operating voltage GND.

The selector switch 13, the comparator 14 as well as the time detector 15 are arranged in a microprocessor 17, to which the positive operating voltage $U_+$ as well as the negative operating voltage GND are fed.

Figure 2:
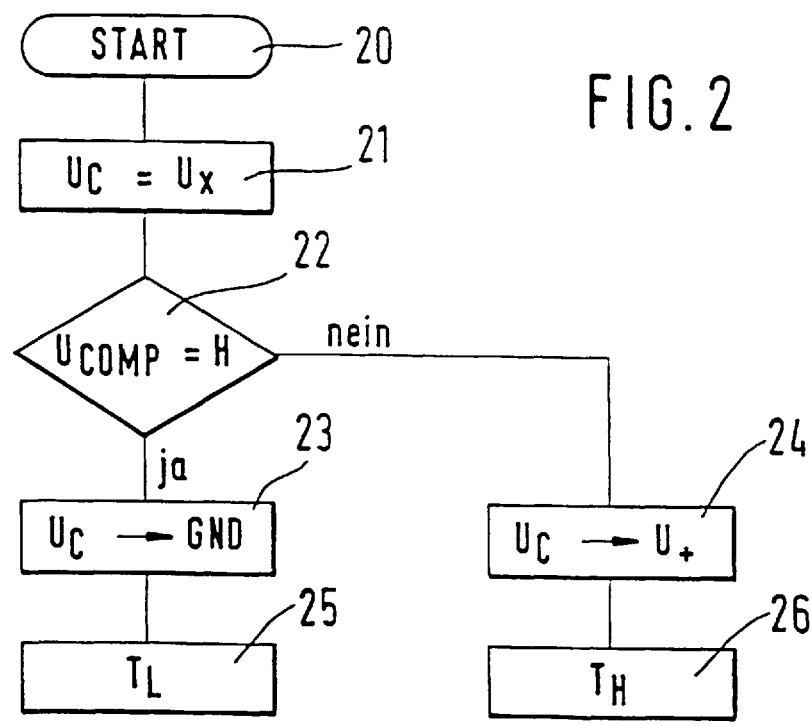
FIG. 2 illustrates a flow diagram which shows the process steps according to the invention.

Following an actuation or start 20, the flow diagram shown in FIG. 2 starts with a first processing step 21 during which the capacitor voltage $U_C$ is charged up to the voltage $U_X$ to be converted. In dependence on an inquiry 22, which determines whether the comparator output signal $U_{COMP}$ shows a high level (H-level), there is a changeover either to a first or a second assignment 23, 24 during a second processing step. For the first assignment 23, the capacitor 10 is connected via a current-limiting element to the negative operating voltage GND and for the second assignment 24, the capacitor is connected via a current-limiting element to the positive operating voltage $U_+$. Following the first assignment 23, a first time detector 25 is provided, which determines a downward integration time $T_L$ for which the capacitor voltage $U_C$ shows a reference voltage $S_L$ from the comparator 14, starting with the voltage $U_X$ to be converted. Following the second assignment 24, a second time detector 26 is planned, which determines an upward integration time $T_H$ during which the capacitor voltage $U_C$ reaches the reference voltage $S_H$ of comparator 14, starting from the voltage $U_X$ to be converted.

Figure 3:
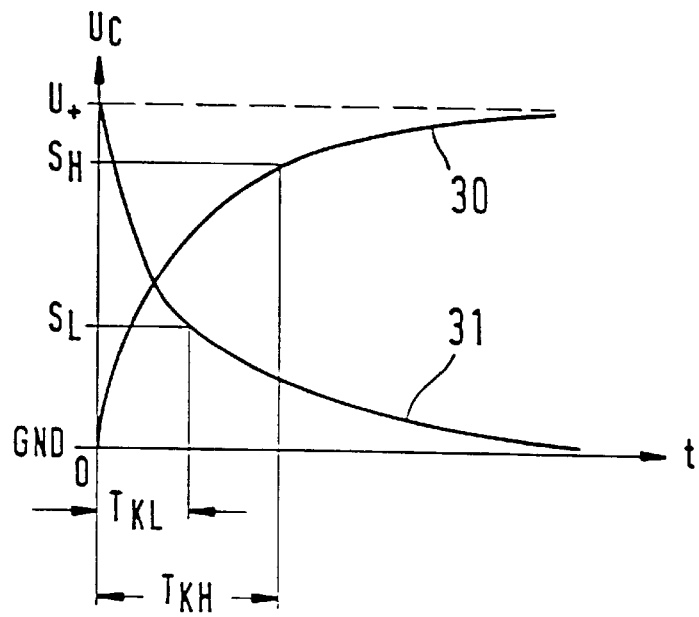
FIG. 3 to 5 show voltage courses for a capacitor shown in FIG. 1, in dependence on the time.

FIG. 3 shows two capacitor voltages $U_C$ in dependence on the time t, which occur during an adaptive learning process of switching thresholds for comparator 14. The switching thresholds of comparator 14 correspond to reference voltages $S_L$, $S_H$ discussed above. A first curve shape 30 starts with the negative operating voltage GND and approaches in an asymptotic way the positive operating voltage $U_+$ through charging via the integrating resistor 12. The time that passes until the first curve shape 30 assumes the voltage $U_C$, which corresponds to an upper switching threshold $S_H$ of comparator 14, for which the comparator 14 switches from low level (L-level) to H-level, is designated as first constant time $T_{KH}$. A lower switching threshold $S_L$ of comparator 14 is learned with the aid of the second curve shape 31, shown in FIG. 3. Starting with a capacitor voltage $U_C$, which corresponds to the positive operating voltage $U_+$, the capacitor 10 is discharged via the integrating resistor 12 until it reaches asymptotically the negative operating voltage GND. The time that elapses until the comparator 14 reaches the lowest switching threshold $S_L$, for which the comparator 14 switches from H-level to L-level, is referred to as the second constant time $T_{KL}$.

Figure 4:
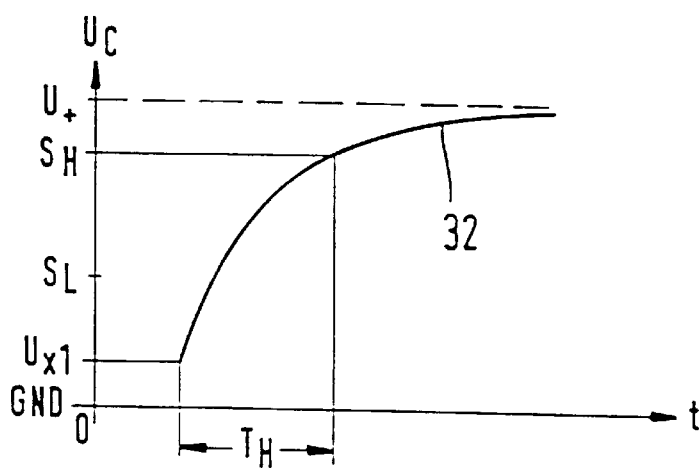

A first signal curve 32 is shown in FIG. 4, for which the capacitor voltage $U_C$ reaches the upper switching threshold $S_H$ of the comparator 14, starting with a first voltage $U_{x1}$ to be converted. The time within which the capacitor voltage $U_C$ increases until it reaches the upper switching threshold $S_H$ of comparator 14, is designated as first conversion time $T_H$.

Figure 5:
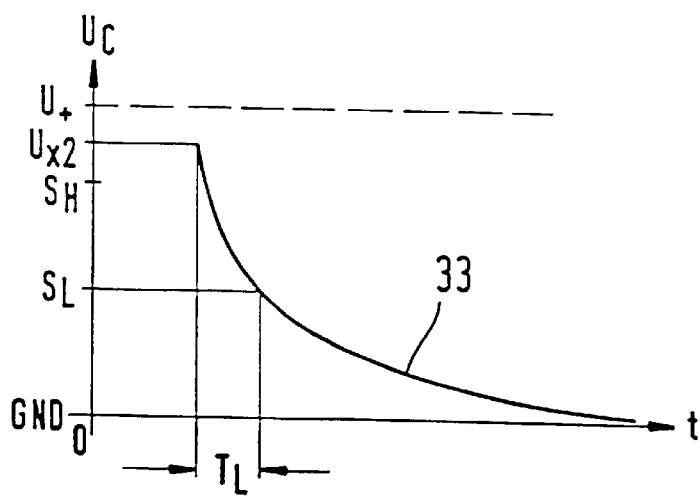

FIG. 5 shows a second signal course 33, for which the capacitor voltage $U_C$ reaches the lower switching threshold $S_L$ of the capacitor 14, starting with a second voltage $U_{x2}$ to be converted. The time during which the capacitor voltage $U_C$ reaches the lower switching threshold $S_L$ of comparator 14 is designated as second conversion time $T_L$.

The process according to the invention is shown with the aid of the block diagram shown in FIG. 1, in connection with the flow diagram shown in FIG. 2 as well as in connection with the signal courses shown in FIGS. 3 to 5:

Insofar as at least one switching threshold $S_H$, $S_L$ of comparator 14 is not known, the at least one unknown switching threshold $S_H$, $S_L$ can be determined experimentally. A possibly existing microprocessor 17, which incorporates preferably the selector switch 13, the comparator 14 as well as the time detector 15, can be used suitably at any time for the adaptive learning of the at least one unknown switching threshold $S_H$, $S_L$ of comparator 14. The absolute value of switching threshold $S_H$, $S_L$ is of no importance for the process according to the invention. However, the first constant time $T_{KH}$ or the second constant time $T_{KL}$ is essential. The two constant times $T_{KH}$, $T_{KL}$ are a measure for the time constant of the RC component 10, 12 that includes the capacitor 10 as well as the integrating resistor 12. The integrating resistor 12 is here used as current-limiting element. A power source, for example is on principle also suitable for such a current-limiting element.

The comparator 14 is preferably an input circuit of a logic switching circuit, which includes the at least one switching threshold $S_H$, $S_L$. Such an input circuit is, for example, located behind input ports of microprocessors. The two switching thresholds $S_H$, $S_L$, which correspond to a hysteresis, have input ports as in a Schmitt Trigger Input. The output signal $U_{COMP}$ of comparator 14 corresponds to the internal logic signal of the input port.

The adaptive learning of the upper switching threshold $T_H$ occurs in that the first curve shape 30, which is shown in FIG. 3, is predetermined. Starting with the no-voltage state of capacitor 10, the first selector switch 13 is switched to the positive operating voltage $U_+$. The capacitor voltage $U_C$ subsequently increases from the starting value that corresponds to the negative operating voltage GND, in accordance with the first curve shape 30. Once the upper switching threshold $S_H$ of comparator 14 is reached, the comparator output signal $U_{COMP}$ jumps from a L-level to a H-level. A precondition for this is that the comparator output signal $U_{COMP}$ shows the L-level below the lower switching threshold $S_L$ and an increasing capacitor voltage does not switch to the H-level until the upper switching threshold $S_H$ is reached. The two switching thresholds $S_H$, $S_L$, which are used as a basis here, are predetermined by a hysteresis value, which in integrated logic circuits is preset by the manufacturer. The time required by selector switch 13 for switching to the positive operating voltage $U_+$ and the time required by the comparator output signal $U_{COMP}$ for changing from the L-level to the H-level corresponds to the first constant time $T_{KH}$, which is stored in a memory that is not shown in FIG. 1.

The following applies:

$$S_H = U_+ * (1-\exp(-T_{KH}/RC)) \quad \text{(equation 1)}$$

wherein R represents the resistance of the integrating resistor 11 and C represents the capacitance value of the capacitor 10.

Correspondingly, the lower switching threshold $S_L$ of the comparator 14 can be learned with the aid of the second curve shape 31. The second curve shape 31 begins with a capacitor voltage $U_C$, which corresponds to the positive operating voltage $U_+$. The approach of the second curve shape 31 to the negative operating voltage GND is caused by an integration downward by the integrating resistor 12, which was switched with the aid of the selector switch 13 to the negative operating voltage GND. The time required for the switching operation of the selector switch 13 to the negative operating voltage GND and the ranges of the lower switching threshold $S_L$ of the comparator 14 corresponds to the second constant time $T_{KL}$, which is also stored in a memory that is not shown in FIG. 1.

The following applies:

$$S_L = U_+ * \exp(-T_{KL}/RC) \quad \text{(equation 2)}$$

Insofar as only one switching threshold of the comparator 14 is provided, either the first curve shape 30 or the second curve shape 31 can be used as a basis for the adaptive learning of the switching threshold. It is only essential that the changeover from L-level to H-level or from H-level to L-level of the comparator output signal $U_{COMP}$ is detected.

An analog/digital conversion starts with the actuation or start 20, shown in FIG. 2, after the at least one switching threshold $S_H$, $S_L$ of comparator 14 is known, wherein the at least one switching threshold $S_H$, $S_L$ corresponds to a reference voltage. In the first process step 21, the capacitor voltage $U_C$ is charged up to the voltage $U_X$ to be converted. The voltage $U_X$ to be converted is transmitted via the input resistor 11 (and integrating resistor 12) to the capacitor 10. The input resistor 11 can be selected large enough, so that fluctuations of the voltage $U_X$ to be converted at least approximately do not influence the conversion during the conversion. For another embodiment, a complete separation of the voltage $U_X$ to be converted from the capacitor 10 can be planned during the following process steps. The capacitor 10 is connected in a second process step via the current-limiting element 12, for example the integrating resistor 12, to a voltage source with a voltage that is higher or lower than the reference voltage of the comparator 14, which corresponds to the at least one switching threshold $S_H$, $S_L$. The integrating resistor 12 can also be arranged in the line that leads to the selector switch 13, so that the input resistor 11 is located directly at the capacitor 10. In the exemplary embodiment shown, the predetermined voltages are the positive operating voltage $U_+$ on the one hand and the negative operating voltage GND of the microprocessor 17 on the other hand.

The inquiry 22 is provided, if necessary, for which the selector switch 13 is activated in dependence on the comparator output signal $U_{COMP}$. Insofar as the comparator output signal shows the H-level, the selector switch 13 is switched to the negative operating voltage GND during the first assignment 23. If the comparator output signal $U_{COMP}$ shows the L-level, the selector switch 13 is switched to the positive operating voltage $U_+$ during the second assignment 24. The above-described preconditions again apply for the level definition. On principle, it is not necessary to activate the selector switch 13 in dependence on the comparator output signal $U_{COMP}$. A sequential, positively actuated switching back and forth between both voltages is also suitable, wherein a level change of the comparator output signal $U_{COMP}$ is achieved in any case in the following second process step. By making the control of selector switch 13, if necessary, dependent on the comparator output signal $U_{COMP}$, it is ensured that in the following second process step a level change of comparator output signal $U_{COMP}$ always occurs following a switching operation.

If the first voltage $U_{x1}$ to be converted is so low that the comparator output signal $U_{COMP}$ shows L-level, then the selector switch is connected during the second process step according to the second assignment 24 to the positive operating voltage $U_+$. Starting with the first converting voltage $U_{x1}$ shown in FIG. 4, the capacitor voltage $U_C$ increases according to the first signal shape 32. When reaching the upper switching threshold $S_H$ of the comparator 14, the comparator output signal $U_{COMP}$ switches from the L-level to the H-level. The time detector 15 determines the time that passes between the switching of selector switch 13 to the positive operating voltage $U_+$ until the upper voltage threshold $S_H$ is reached, which is the same as the first conversion time $T_H$.

The following applies:

$$S_H = U_{x1} + (U_+ - U_{x1}) * (1-\exp(-T_{KH}/RC)) \quad \text{(equation 3)}$$

When equation 3 is set equal to equation 1, the following results are obtained:

$$S_H = UX1 + (U_+ - U_{x1}) * (1-\exp(-T_{KH}/RC))$$

$$= U_+ * (1-\exp(-T_{KH}/RC))$$

From this follows for $U_{x1}$:

$$U_{x1} = U_+ * (1-\exp(-T_{KH}/RC))$$

From this, it follows that the first voltage $U_{x1}$ to be converted depends only on the first conversion time $T_H$. The other values that appear are known.

If the voltage $U_X$ to be converted is high enough so that the comparator output signal $U_{COMP}$ shows the H-level, then the selector switch 13 is switched during the first assignment 23 in the second process step to the negative operating voltage GND. The signal course 33 shown in FIG. 5 starts accordingly with the second voltage $U_{x2}$ to be converted and subsequently drops to lower voltage values. When reaching the lower switching threshold $S_L$ of the comparator 14, the comparator output signal changes from H-level to L-level. The time detector 15 detects the time that has passed between the switching of selector switch 13 and the level change as second conversion time $T_L$.

The following applies:

$$S_L = U_{x2} * \exp(-T_L/RC) \quad \text{(equation 4)}$$

By setting equation 2 equal to equation 4, the following results:

$$S_L = U_{x2} * \exp(-T_L/RC) = U_+ * (-T_{KL}/RC)$$

From this it follows for $U_{x2}$:

$$U_{x2} = U_+ * \exp(T_L - T_{KL})/RC)$$

Thus, the second voltage to be converted $U_{x2}$ only depends on the second conversion time $T_L$. The other values are known.

The time detector 15, which determines either the first or the second conversion time $T_H$, $T_L$, further transmits these times, which already constitute a measure for the electric signal to be converted, as resulting signal 16 for further calculation preferably within the microprocessor 17, where the times $T_H$ or $T_L$ are converted, for example, to a voltage data or a current data. The results of the exponential functions are preferably determined with tables, which are stored in a memory of microprocessor 17 that is not shown in more detail.

I claim:

1. A process for analog/digital conversion of an electric voltage comprising the steps of:

charging a capacitor up to a voltage to be converted by transmitting said voltage to be converted to a second port of the capacitor, the capacitor having a first port which is connected to a fixed potential;

comparing the voltage at the capacitor to a reference voltage and determining a recharging direction by selecting an operating voltage from a variable voltage source by using a comparator;

recharging said capacitor by connecting the second port via a current-limiting element to the selected operating voltage;

determining the amount of time that passes between the selecting of the operating voltage and reaching the reference voltage at the capacitor; and evaluating the determined time as a measure for the voltage to be converted.

2. The process according to claim 1, wherein the comparing step uses the comparator to determine the reference voltage, said comparator having a switching hysteresis which results in an upper switching threshold or reference voltage and a lower switching threshold or reference voltage.

3. The process according to claim 1, wherein the comparing step further includes adaptive learning of the reference voltage, the reference voltage being a switching threshold of the comparator.

4. A device for analog/digital conversion of an electric voltage comprising:

a capacitor having a first port connected to a fixed potential and a second port for receiving the voltage to be converted;

a selector switch;

an integrating resistor as a current-limiting element, said capacitor being connected to one of a plurality of voltage sources via the selector switch and the integrating resistor for recharging;

a comparator for switching the selector switch to one of the plurality of voltage sources and comparing the voltage at the capacitor with a reference voltage, wherein the direction of the recharging is determined by the selection of one of the plurality of voltage sources; and a time detector connected to the comparator for receiving the comparator output signal, the time detector determining the amount of time that passes from the selection of one of the plurality of voltage sources until the capacitor reaches the reference voltage, wherein the determined time is evaluated as a measure for the voltage to be converted.

5. The device according to claim 4 further comprising an input resistor and wherein the voltage to be converted can be connected to the capacitor via the input resistor.

6. The device according to claim 4 wherein the selector switch exhibits a high-ohmic switching state.

7. The device according to claim 4 wherein the selected voltage from the plurality of voltage sources corresponds to a positive or negative operating voltage.

8. The device according to claim 4 further comprising a microprocessor and wherein the selector switch, the comparator and time detector are components of the microprocessor.

9. The device according to claim 10 wherein the comparator constitutes an input circuit of a logic switching circuit.

10. The device according to claim 9 further comprising a microprocessor and wherein the input circuit is a component of an input port for the microprocessor.

11. The device according to claim 4 wherein the comparator constitutes an input circuit of a logic switching circuit.

12. The device according to claim 11 further comprising a microprocessor and wherein the input circuit is a component of an input port for the microprocessor.

* * * * *